US012620983B2

(12) United States Patent
Cottin

(10) Patent No.: US 12,620,983 B2
(45) Date of Patent: May 5, 2026

(54) HALF-BRIDGE CIRCUIT FOR TWO-WIRE BUSES

(71) Applicant: STMicroelectronics International N.V., Geneva (CH)

(72) Inventor: Denis Cottin, Crolles (FR)

(73) Assignee: STMicroelectronics International N.V., Geneva (CH)

( * ) Notice: Subject to any disclaimer, the term of this patent is extended or adjusted under 35 U.S.C. 154(b) by 146 days.

(21) Appl. No.: 18/747,827

(22) Filed: Jun. 19, 2024

(65) Prior Publication Data

US 2025/0015791 A1     Jan. 9, 2025

(30) Foreign Application Priority Data

Jul. 5, 2023     (FR) ........................................ 2307153

(51) Int. Cl.
  *H03K 17/06*          (2006.01)
  *H03K 17/10*          (2006.01)
(52) U.S. Cl.
  CPC ......... *H03K 17/063* (2013.01); *H03K 17/102* (2013.01); *H03K 2217/0081* (2013.01)
(58) Field of Classification Search
  CPC ........................... H03K 17/063; H03K 17/102
  See application file for complete search history.

(56) References Cited

U.S. PATENT DOCUMENTS

| | | | | |
|---|---|---|---|---|
| 5,940,333 A * | 8/1999 | Chung | .................... | G11C 16/30 365/189.11 |
| 6,060,914 A * | 5/2000 | Nunokawa | .......... | G11C 27/026 327/309 |
| 6,356,137 B1 * | 3/2002 | Roohparvar | .......... | G11C 16/12 327/390 |
| 6,411,048 B1 * | 6/2002 | Maige | .................... | H03K 4/625 348/E3.033 |
| 6,559,689 B1 * | 5/2003 | Clark | ................... | H03K 17/063 327/91 |
| 7,114,084 B2 * | 9/2006 | Cioaca | ...................... | G06F 1/28 713/323 |
| 7,692,501 B2 * | 4/2010 | Hsueh | ..................... | H03L 7/091 331/25 |

(Continued)

OTHER PUBLICATIONS

Wang, Yang et al., "Robust dual-direction SCR with low trigger voltage, tunable holding voltage for high-voltage ESD protection" Microelectronics Reliability, vol. 55, Feb.-Mar. 2015, pp. 520-526.

*Primary Examiner* — Menatoallah Youssef
*Assistant Examiner* — Khareem E Almo
(74) *Attorney, Agent, or Firm* — Slater Matsil, LLP

(57)          ABSTRACT

The present disclosure relates to a half-bridge circuit comprising first and second PMOS transistors in series between the first node and an intermediate node, a third PMOS transistor and a fourth NMOS transistor in series between the intermediate node and the second node, and a control circuit. The control circuit comprises a bootstrap charge pump. The charge pump comprises a capacitive element having a first electrode coupled with the gate of the third transistor. The charge pump is configured to charge the capacitive element from the intermediate node and without a clock signal. The present application also relates to a device comprising two identical half-bridge circuits connected to two respective conductors of a bus.

20 Claims, 5 Drawing Sheets

(56)  References Cited

U.S. PATENT DOCUMENTS

| | | | |
|---|---|---|---|
| 10,461,964 | B1 | 10/2019 | Cherkassky et al. |
| 11,601,301 | B2 | 3/2023 | Stegemann et al. |
| 12,095,351 | B2 * | 9/2024 | Abesingha ............ H02M 3/158 |
| 2017/0019095 | A1 * | 1/2017 | Leong ................... H03K 17/167 |
| 2017/0338823 | A1 * | 11/2017 | Reinhold ................ H02M 3/07 |
| 2020/0052687 | A1 * | 2/2020 | Ming .................... H03K 17/063 |
| 2022/0123958 | A1 | 4/2022 | Repp et al. |
| 2022/0337149 | A1 * | 10/2022 | Ionescu ................... H02M 3/07 |
| 2023/0120432 | A1 * | 4/2023 | Womac ................ H03K 17/063 |
| | | | 323/282 |
| 2024/0146292 | A1 * | 5/2024 | Lee ...................... H03K 17/063 |

* cited by examiner

HALF-BRIDGE CIRCUIT FOR TWO-WIRE BUSES

CROSS-REFERENCE TO RELATED APPLICATIONS

This application claims the priority benefit of French patent application no. 2307153, filed on Jul. 5, 2023, entitled "Half-bridge circuit for two-wire buses," which is hereby incorporated herein by reference to the maximum extent allowable by law.

TECHNICAL FIELD

The present description relates generally to electronic circuits, for example integrated electronic circuits. More particularly, the present description relates to a device configured to be connected to a two-wire bus in order to transmit digital data or bits.

BACKGROUND ART

Systems comprising a two-wire bus, i.e., a bus consisting of two conductive lines on which bits are transmitted with devices connected to the two-wire bus, are known.

Among these known systems, some systems include two-wire differential bus, for example systems including a R5-485-type bus. On a differential bus, the useful signal corresponds to the voltage between the two conductive lines of the bus, i.e., the differential voltage of the bus.

To control the differential voltage of the bus, the devices connected to the differential two-wire bus each include a bus write circuit, also known as a driver.

Known circuits (or devices) for writing to a differential two-wire bus have their drawbacks.

SUMMARY

There is a need to overcome some or all of the drawbacks of two-wire bus devices, and in particular devices for writing to a differential two-wire bus.

For example, there is a need for a device for writing to a differential two-wire bus that increases the maximum value that the differential voltage of the bus can take, compared with known devices.

For example, there is a need for such a device to be robust enough to withstand electrostatic discharges (ESD) on each of the conductive lines of the bus, for example 12 kV electrostatic discharges as defined by the International Electrotechnical Commission (IEC).

For example, there is a need for such a device that also enables it to be robust to, i.e., withstand without damage, shifts in its reference voltage, for example GND, between this device and another similar device connected to the two-wire bus.

One embodiment address some or all of the drawbacks of known two-wire bus devices.

In particular, one embodiment address some or all of the known devices for writing to a differential two-wire bus.

For example, one embodiment provides a device for writing to a differential two-wire bus that enables the value of the differential voltage on the bus to be increased compared with similar known devices.

For example, one embodiment provides for such a device to further withstand electrostatic discharges on either of the two bus conductor lines, for example 12 kV electrostatic discharges as defined by the International Electrotechnical Commission.

For example, one embodiment provides for such a device to further withstand reference voltage offsets of the device relative to other similar devices connected to the two-wire bus.

For example, one embodiment provides such a device for use with an RS-485 type bus.

One embodiment provides a half-bridge circuit comprising:

a first PMOS transistor having its drain connected to a first node for applying a power supply potential and its source connected to its body region;

a second PMOS transistor having its source connected to its body region and to the source of the first transistor, and its drain connected to an intermediate node;

a third PMOS transistor having its drain connected to the intermediate node and its source connected to its body region;

a fourth NMOS transistor having its drain connected to the source of the third transistor and its source connected to a second node for applying a reference potential; and a control circuit of the third transistor comprising a bootstrap charge pump, the charge pump comprising a capacitive element having a first electrode coupled with, preferably connected to, the gate of the third transistor, the charge pump being configured to charge the capacitive element from the intermediate node and without a clock signal.

According to one embodiment:

the capacitive element has a second electrode coupled with the drain or source of the third transistor; and the charge pump comprises:

a first diode having its anode coupled with the gate of the third transistor and its cathode coupled with the second node, and at least one of a resistor connected between the source and the gate of the third transistor, and a Zener diode connected between the source and the gate of the third transistor with its anode at the gate side.

According to one embodiment:

the second electrode of the capacitive element is coupled with, preferably connected to, the source of the third transistor; and the charge pump comprises the Zener diode connected between the source and the gate of the third transistor.

According to one embodiment, the second electrode of the capacitive element is coupled with, preferably connected to, the drain of the third transistor.

According to one embodiment, the control circuit further comprises a first switch coupling the first diode with the second node, the control circuit being configured to control the first switch from a first binary signal.

According to one embodiment, the first signal is at least in part determined from a signal for enabling/disabling the half-bridge circuit so that the first switch is open when the enabling/disabling signal indicates the half-bridge circuit has to be disable.

According to one embodiment, the first switch is implemented by a NMOS transistor having its source connected to its body region, its drain coupled with, preferably connected to, the first diode, and its source coupled with, preferably connected to, the second node.

According to one embodiment:

the half-bridge circuit further comprises a detection circuit configured to deliver a second binary signal indicating when a potential of the intermediate node of the set is less than the reference potential; and the first signal is determined at least in part from the second signal so that the first switch of the control circuit is open when the second signal indicates that the potential at the intermediate node is less than the reference potential.

According to one embodiment, the control circuit is configured to drive the gate of the third transistor to the supply voltage when the second signal indicates that the potential at the intermediate node is less than the reference potential.

According to one embodiment, the control circuit comprises a second switch coupling the gate of the third transistor with the first node, and a resistor coupling the gate of the third transistor with the anode of the first diode, the control circuit being configured to turn the second switch to the ON state when the second signal indicates that the potential at the intermediate node is less than the reference potential.

According to one embodiment:

the second switch comprises:

two PMOS transistors in series between the first node and the gate of the third transistor and having sources connected to each other, and a resistor coupling the gate of each of the two PMOS transistors with the sources of the two PMOS transistors;

the control circuit comprises a third switch, for example a NMOS transistor, coupling the gates of its two PMOS transistors with the second node; and the control circuit is configured to turn its third switch to the ON state when the second signal indicates that the potential at the intermediate node is less than the reference potential.

According to one embodiment, the detection circuit configured to deliver the second signal comprises:

two identical resistors in series between the first and second nodes, a third node interconnecting the two resistors with each other being configured to deliver a reference voltage; a first resistor and a second resistor connected to a fourth node, the first resistor being connected between the first node and the fourth node, the second resistor having a value higher than the first resistor and being connected between the fourth node and the intermediate node; a PMOS transistor connected between the first node and the fourth node, and having its source and gate connected to the first node;

a NMOS transistor connected between the fourth node and the second node and having its source and gate connected to the second node, the fourth node being configured to deliver a first voltage; and a comparator configured to compare the first voltage with the reference voltage, and to deliver the second signal.

According to one embodiment, the half-bridge circuit comprises a control circuit of the first transistor configured to turn the first transistor at the ON state when the second transistor is ON.

According to one embodiment, the half-bridge circuit comprises:

a detection circuit configured to deliver a third signal indicating when the potential at the intermediate node is higher than the power supply potential; and a control circuit of the first transistor configured to:

turn the first transistor at the ON state when the second transistor is ON and that the third signal indicates that the potential at the intermediate node is less than the power supply potential; and turn the first transistor at the OFF state when the third signal indicates that the potential at the intermediate node is higher than the power supply potential.

According to one embodiment, the detection circuit configured to deliver the third signal comprises:

a third resistor and a fourth resistor connected to a fifth node, the third resistor being connected between the intermediate node and the fifth node, the fourth resistor having a value lower than the third resistor and being connected between the fifth and second nodes;

a PMOS transistor connected between the first node and the fifth node and having its source and gate connected to the first node;

a NMOS transistor connected between the second node and the fifth node and having its source and gate connected to the second node, the fifth node being configured to deliver a second voltage; and a comparator configured to compare the second voltage and the reference voltage, and to deliver the third signal.

According to one embodiment, the half-bridge circuit comprises a control circuit of the second and fourth transistors configured to:

control an OFF state of the fourth transistor and an ON state of the second transistor when a write control signal is at a first state;

control an OFF state of the second transistor and an ON state of the fourth transistor when the write control signal is at a second state; and control the OFF state of each of the second and fourth transistors when the write control signal is at a third state.

One embodiment provides a device comprising:

first and second terminals intended to be respectively connected to first and second lines of a two-wire bus;

two identical half-bridge circuits as described above, a first of the two half-bridge circuits having its mid-node connected to the first terminal and a second of the two half-bridge circuits having its intermediate node connected to the second terminal.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various Figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the various known circuits, systems and applications comprising a differential two-wire bus and devices for writing to this bus have not been detailed, the embodiments and variants described here being compatible with these known circuits, systems and applications.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the Figures.

Unless specified otherwise, the expressions "around", "approximately", "substantially" and "in the order of" signify within 10%, and preferably within 5%.

Figure 1:
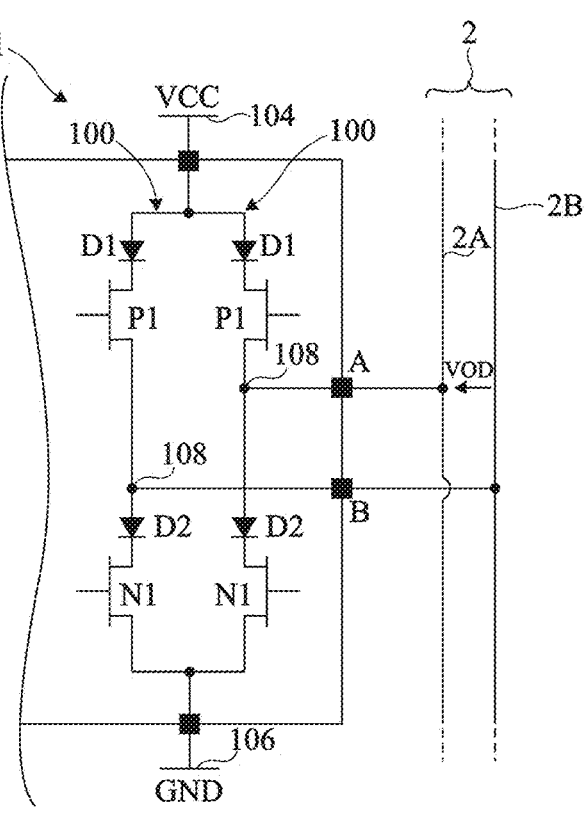
FIG. 1 illustrates an example device for writing on a two-wire bus.

FIG. 1 illustrates an example device 1 for writing on a two-wire bus 2, and, more specifically, on a differential two-wire bus 2. In FIG. 1, the device 1 is partially shown.

Bus 2 comprises two electrically conductive wires (or electrically conductive lines) 2A and 2B. A differential voltage VOD of the bus 2 is available between the lines 2A and 2B, the voltage VOD being, for example, referenced to the potential of the line 2B, or, in other words, the differential voltage being, for example, defined by VOD=V(2A)−V(2B), with V(2A) the potential on line 2A, and V(2B) the potential on line 2B.

The device 1 comprises two identical sets (or half-bridge structures or circuits) 100. Each of the two sets 100 is connected between a node 104 configured to receive a power supply potential Vcc from the device 1 and a node 106 configured to receive a reference potential GND from the device 1. The potential Vcc is positive with respect to the potential GND. For example, the potential Vcc has a value substantially equal to 3.3 V or 5 V.

By way of example, when several devices 1 are connected to the bus 2, each device 1 is connected to a separate node 104, the nodes 104 all belonging to the same conductive line receiving the potential Vcc, and each device 1 is connected to a separate node 106, the nodes 106 all belonging to the same conductive line receiving the potential GND.

Each of the two sets 100 includes an intermediate node 108. The node 108 of one of the two sets 100 is different from the node 108 of the other of the two sets 100. The node 108 of one of the sets 100 is connected to a terminal A of the device 1 for connection to the conductor 2A of the bus 2, and the node 108 of the other of the sets 100 is connected to a terminal B of the device 1 for connection to the conductor 2B of the bus 2.

Each of the two sets 100 comprises a diode D1, a transistor P1, a diode D2, and a transistor N1 connected in series, in this order, between the node 104 and the node 106. In each set 100, the transistor P1 is a P-channel MOS (Metal Oxide Semiconductor) transistor, or PMOS, while the transistor N1 is an N-channel MOS transistor, or NMOS. In each set 100, the diode D1 and the transistor P1 are connected in series between the node 104 and the node 108 of the set, so that the diode D1 is in anti-series with the body diode of the transistor P1, the diode D2, and the transistor N1 being connected in series between the node 108 of the set and the node 106, so that the diode D2 is in anti-series with the body diode of the transistor N1. In each set 100, the anodes of diodes D1 and D2 are on the node 104 side.

For example, in each set 100, the anode of the diode D1 is connected to the node 104, the cathode of the diode D1 is connected to the source (or first conduction terminal) of the transistor P1, the source of the transistor P1 is connected to its channel-forming region (also called, for example, "body region"), the drain (or second conduction terminal) of the transistor P1 is connected to the node 108 of the set, the anode of the diode D2 is connected to the node 108 of the set, the cathode of the diode D2 is connected to the drain (or second conduction terminal) of the transistor N1, and the source (or first conduction terminal) of the transistor N1 is connected to the cathode of the diode D2 and to the channel-forming region of the transistor N1.

By way of example, to write a first binary value on the bus 2, the device 1 is configured to:

turn on the transistor P1, and turn off the transistor N1 of the set 100 connected to the terminal A, and turn off the transistor P1, and turn on the transistor N1 of the set 100 connected to the terminal B, and, to write a second binary value to the bus 2, the device 1 is configured to:

turn on the transistor P1, and turn off the transistor N1 of the set 100 connected to the terminal B, and turn off the transistor P1, and turn on the transistor N1 of the set 100 connected to the terminal A.

In the example above, the voltage VOD is positive when writing the first binary value, and negative when writing the second binary value.

By way of example, when the device 1 is not writing to the bus, the device 1 is configured to leave the transistors P1 and N1 of the two sets 100 in the blocked state.

In the device 1, the provision, or presence, of the diodes D1 prevents leakage currents from flowing through the transistors P1 when the potential of the conductor 2A and/or conductor 2B becomes greater than the potential Vcc, for example following an electrostatic discharge on either or both conductors 2A and 2B, such an electrostatic discharge being referred to as positive. Symmetrically, the provision of the diodes D2 prevents leakage currents from flowing through the transistors N1 when the potential of the conductor 2A and/or conductor 2B falls below the potential GND, for example following an electrostatic discharge on either or both conductors 2A and 2B, such an electrostatic discharge being said to be negative.

In addition, the provision or presence of diodes D1 prevents leakage currents from flowing through the transistors P1 when the potential of the conductor 2A and/or conductor 2B becomes higher than the potential Vcc, for example as a result of a shift in the ground GND of the device 1 relative to another device 1 connected to the bus 2, the length of the bus 2 between these two devices 1, i.e., the distance between these two devices 1, being, for example, of the order of several hundred meters. Such a ground GND offset is referred to as a positive ground offset, for example. Symmetrically, the provision, or presence, of the diodes D2 prevents leakage currents from flowing through the transistors N1 when the potential of the conductor 2A and/or conductor 2B becomes lower than potential GND, for example following a shift in the ground GND of the device 1 relative to another device 1 connected to the bus 2, the length of the bus 2 between these two devices 1, i.e., the distance between these two devices 1, being, for example, of the order of several hundred meters. Such a ground offset GND is referred to, for example, as a negative ground offset.

However, when the potential of the two conductors 2A and 2B is well between the potentials Vcc and GND, the provision, or presence, of the diodes D1 and D2 causes voltage drops across the diodes, which reduces the maximum positive value and the maximum negative value that the differential voltage VOD can have.

Using Schottky diodes rather than PN junction diodes to implement the D1 and D2 diodes reduces the voltage drop across the diodes, since the on-state kink voltage of Schottky diodes is a few hundred millivolts lower than that of a PN junction diode. However, the use of integrated Schottky diodes is not always possible, depending on the technology used to manufacture the device 1. This is the case, for example, when the device 1 is implemented in BCD (bipolar CMOS DMOS) technology, combining bipolar transistors, CMOS (complementary MOS) circuits, and DMOS (double-diffused MOS) transistors on the same chip. In addition, for a given technology, implementing the D1 and D2 diodes with Schottky diodes is not compatible with a potential Vcc higher than 4.8 V, since the maximum potential Vcc allowed for this given technology is 4.8 V. However, some applications require a potential Vcc higher than 4.8 V, e.g., a potential Vcc of 5.5 V.

In addition, the diodes D1 and D2 can each be implemented by a PMOS transistor having its source connected to its channel-forming region, and being diode-connected so that its drain-body diode implements the corresponding diode D1 or D2.

Preferably, the transistors D1 and D2 are then high-voltage PMOS transistors, for example extended-drain PMOS transistors, with a voltage withstand Vds (where Vds is the drain-source voltage of the transistor) greater than that of standard PMOS transistors. However, these high-voltage PMOS transistors then exhibit higher voltage drops between their conduction terminals in the off-state than with standard PMOS transistors, which is undesirable. These higher off-state voltage drops in extended-drain MOS transistors result, for example, from the additional series resistance on the drain side that is inherent in extended-drain MOS transistors.

Figure 2:
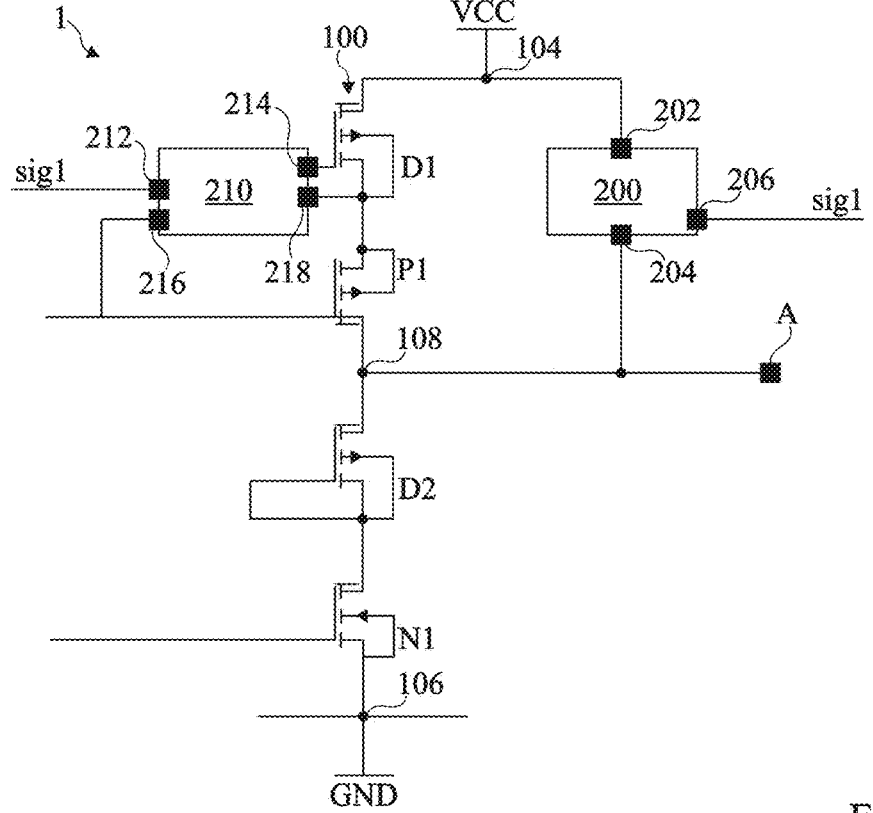
FIG. 2 illustrates another example of the device shown in FIG. 1.

FIG. 2 illustrates another example of the device 1 of FIG. 1, in which the diodes D1 and D2 are each implemented by a corresponding PMOS transistor having its source connected to its channel-forming region. More specifically, FIG. 2 represents only one set 100 of the device 1, namely the one connected to the terminal A, the other set 100 not shown is identical to the set 100 shown with the only difference that it is connected to the terminal B.

In this example, the diode D2 is a PMOS transistor with its source connected to the drain of the transistor N1 and to the body region of the transistor D2. In addition, in this example, the transistor D2 has its gate connected to its source. In this way, the body diode (or drain-body diode) of the transistor D2 is in anti-serial with the body diode of the transistor N1.

Furthermore, in this example, the diode D1 is a PMOS transistor with its source connected to the source of the transistor P1 and to the body region of the transistor D1. In this way, the body diode (or drain-body diode) of the transistor D1 is in anti-serial with the body diode of the transistor P1.

In this example, the set 100 further comprises a detection circuit 200 configured to provide a signal sig1, for example a binary signal, indicating when the potential of the node 108 of the set 100 is greater than the power supply potential Vcc. For example, the circuit 200 comprises a terminal 202 connected to the node 104, a terminal 204 connected to the node 108 of the set 100, and a terminal 206 configured to provide the signal sig1.

By way of example, the signal sig1 is a signal in a first binary state, for example a high state corresponding to the potential Vcc, when the potential of the node 108 of the set is greater than the potential Vcc, and in a second binary state, for example a low state corresponding to the potential GND, when the potential of the node 108 of the set is less than the potential Vcc.

In other words, the signal sig1 indicates when a positive electrostatic discharge, or a positive ground offset occurs on the node 108 of the set, with the circuit 200 configured to detect this positive electrostatic discharge, and to detect this positive ground offset.

In the example shown in FIG. 2, the set 100 also includes a circuit 210 for controlling the transistor D1. The circuit 210 is configured to control the transistor D1 from the control signal of the transistor P1, i.e., from the gate-source voltage of the transistor P1. Furthermore, in this example, the circuit 210 is configured to control the transistor D1 also from the signal sig1.

The circuit 210 comprises, for example, a terminal 212 configured to receive the signal sig1 and a terminal 214 connected to the gate of the transistor D1. The circuit 210 further comprises, for example, a terminal 216 connected to the gate of the transistor P1 and may comprise a terminal 218 connected to the source of the transistor P1.

More particularly, in this example, the circuit 210 is configured to:

turn the transistor D1 on when the transistor P1 is on and the signal sig1 indicates that the node 108 potential is less than the potential Vcc; and turn the transistor D1 off when the signal sig1 indicates that the node 108 potential is greater than the potential Vcc.

Thus, in the absence of a positive ESD on the node 108 and a positive ground offset, when the transistor P1 is switched on, the circuit 210 switches the transistor D1 on, thereby reducing the voltage drop across the conduction terminals of the transistor D1 compared with a case where the latter would simply be connected as a diode (gate and source connected, no control signal applied to the gate). This allows the maximum positive and negative values of the differential voltage VOD to be increased compared with the case where the transistor D1 would simply be connected as a diode.

Furthermore, in the event of a positive ESD at the node 108 of the set, or a positive ground offset, switching the transistor D1 off enables its body diode to prevent current from flowing from the node 108 to the node 104. In other words, by switching the transistor D1 off in the event of a positive ESD on the node 108 of the set, or a positive ground offset, the transistor D1 operates as if it were connected as a diode.

However, in the device 1 shown in FIG. 2, the transistor D2 is simply connected as a diode. As a result, when a first or second value is written to the bus 2 by the device 1, and in the absence of ESD and ground offset, the bus common-mode potential is not centered at Vcc/2, which is undesirable.

Furthermore, when the transistor D2 is implemented by a high-voltage PMOS transistor with better voltage handling than a standard PMOS transistor, the voltage drop across its conduction terminals is higher than if the transistor D2 were implemented with a standard diode-mounted PMOS transistor. This higher voltage drop reduces the maximum positive and negative values of the differential voltage VOD, compared with the case where the transistor D2 would be implemented with a standard diode-mounted PMOS transistor.

By way of example, the implementation of the transistors D1, D2, P1, and N1 by high-voltage MOS transistors, for example extended-drain MOS transistors, enables the device 1 to be compatible with a voltage on each of the respective terminals A and B that can vary between −7 V and +12 V. By way of example, the implementation of the transistors D1, D2, P1, and N1 by high-voltage MOS transistors, for example extended-drain MOS transistors, further enables the device 1 to be robust to positive ESDs of up to +24 V, and to negative ESDs of up to −24 V. For example, the voltage withstand of high-voltage PMOS transistors is of the order of 32 V, and the voltage withstand of high-voltage NMOS transistors is of the order of 42 V.

Provided here is a device for a two-wire bus, and, more particularly, a device 3 for writing on a differential two-wire bus 2, similar to the device 1 of FIG. 2 but in which the sets 100 are each replaced by a set (or half-bridge circuit) 300. The sets 300 are identical to the sets 100 with the difference that they each include a control circuit for their transistor D2.

According to one embodiment, in each set 300, the control circuit for the transistor D2 of the set comprises a bootstrap charge pump. The charge pump comprises a capacitive element having a first electrode coupled with, preferably connected to, the gate of the transistor D2. In addition, the charge pump is configured to charge the capacitive element from the intermediate node and without a clock signal.

According to one embodiment, in each set 300, the capacitive element (C) has a second electrode coupled with the drain or source of the third transistor (D2), and, the charge pump comprises a diode having its anode coupled with the gate of the transistor D2 and its cathode coupled with the node 106, and at least one of a resistor connected between the source and the gate of the transistor D2 and a Zener diode connected between the source and the gate of the transistor D2 with its anode on the gate side thereof.

According to one embodiment, in each of the sets 300, the control circuit is configured to switch the transistor D2 on when the transistor N1 of the set is on, and to thus reduce the voltage drop across D2 compared with the case where it would be off and only its body diode would then be used.

According to one embodiment, in each set 300, the control circuit is further configured to enable the control circuit of the transistor D2 in response to a device enabling/disabling signal, i.e., to trigger the transistor D2 to the OFF state, so that the transistor D2 becomes diode-equivalent again when the enabling/disabling signal of the device 3 indicates that the device is to be disabled. In this case, the control circuit is, for example, configured to switch the transistor D2 on when the transistor N1 of the set is on and the enabling/disabling signal indicates that the device should be enabled.

According to one embodiment, in each set 300, the control circuit is further configured to control an OFF state of the transistor D2 when it receives an indication that the potential of the node 108 of the set 300 is lower than the potential GND (negative ESD or negative ground offset). In this case, the control circuit is configured to switch the transistor D2 on when the transistor N1 of the set is on, the enabling/disabling signal indicates that the device should be enabled, no negative ESD is present (or detected) on the node 108 of the set, and no negative ground offset is detected.

Figure 3:
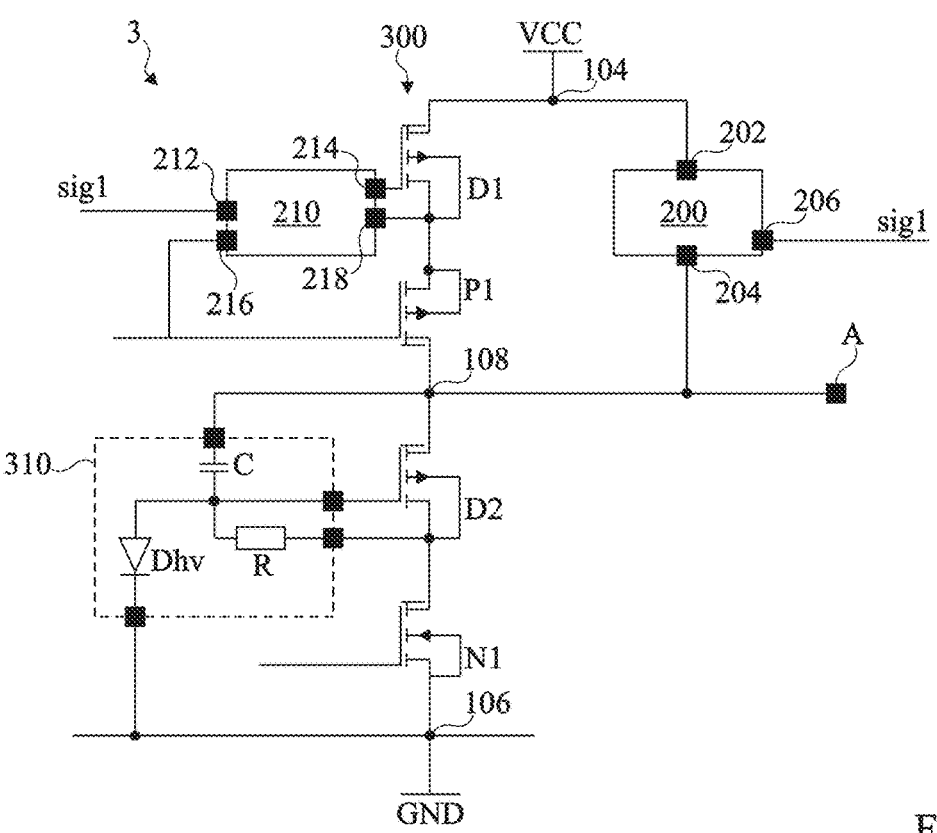
FIG. 3 illustrates an example embodiment of a device for a differential two-wire bus, and, more specifically, a device for writing to a differential two-wire bus.

FIG. 3 illustrates an example of how such a device 3 can be used to write to the two-wire differential bus 2. In the device 3, the sets 100 are each replaced by a set 300.

FIG. 3 shows only the set 300 of the device 3 connected to the terminal A, the other set 300 connected to the terminal B being identical to that shown.

The set 300 has many elements in common with the set 100 described in relation to FIG. 2, and only the differences between these two sets 300 and 100 are highlighted here. Thus, unless otherwise indicated, all that has been indicated for the set 100 of FIG. 2 applies to the set 300 described here in relation to FIG. 3.

In particular, compared with the set 100 shown in FIG. 2, the gate of the PMOS transistor D2 in the set 300 is not connected to the source of this transistor D2.

The set 300 also includes a control circuit 310 for its transistor D2.

The circuit 300 comprises a capacitive element C. The capacitive element C has a first electrode coupled with, preferably connected to, the gate of the transistor D2, and a second electrode coupled with, for example connected to, the drain of the transistor D2.

More specifically, in the embodiment shown in FIG. 3, the capacitive element C has its first electrode connected to the gate of the transistor D2, and its second electrode connected to the drain of the transistor D2.

The circuit 310 also includes a diode Dhv. The diode Dhv has its anode coupled with, for example connected to, the gate of the transistor D2, and its cathode with, for example connected to, the node 106. By way of example, the diode Dhv is implemented by a PN junction diode or by a diode-connected MOS transistor.

More specifically, in the embodiment shown in FIG. 3, the diode Dhv has its anode connected to the gate of the transistor D2, and its cathode connected to the node 106.

In addition, the circuit 310 comprises at least one of a resistor R connected between the source and the gate of the transistor D2, and a Zener diode D2 connected between the source and the gate of the transistor D2 with its anode on the gate side.

More specifically, in the embodiment shown in FIG. 3, where the element C couples the gate and source of the transistor D2 with each other, the circuit 310 comprises only the resistor R. However, in a variant where the element C couples the gate and source of the transistor D2 with each other, the resistor R can be replaced by the diode D2 with its anode on the gate side of the transistor D2. In yet another variant where the element C couples the gate and source of the transistor D2 with each other, the diode D2 is connected in parallel with the resistor R, between the source and gate of the transistor D2, with the anode of the diode D2 on the gate side of the transistor D2.

The provision, or presence, of the diode D2 between the gate and source of the transistor D2 allows, for example, the maximum value that the gate-source voltage of transistor D2 can have to be limited, so as to protect the transistor D2 from excessively high gate-source voltage values that could damage it.

Providing a resistor R between the gate and source of the transistor D2, the gate potential of the transistor D2 is fixed in the absence of current flowing through the transistor D2. When the circuit 310 comprises only the diode D2 and is devoid of the resistor R, this function is performed by the diode D2 via its leakage current. In this case, the diode D2 behaves like a resistor, e.g., a resistor with a high resistance value, such as several hundred kilo-ohms or even a few mega-ohms.

For example, the resistance value of the diode D2 or resistor R is selected sufficiently high so that the capacitor C does not discharge through this resistive element R or D2 when the circuit 310 operates as a charge pump as will be explained later, while ensuring that the gate and source of the transistor D2 are not left at floating potentials when no current is flowing through transistor D2. Those skilled in the art will be able to size the resistor R and/or diode D2 to achieve the operation presented in this description.

In practice, although not shown in FIG. 3, the device 3 comprises a control circuit configured to control the transistors P1 and N1 when writing to the bus 2. This control circuit for the two transistors P1 and N1 is configured to control these transistors P1 and N1 in the manner described in relation to FIGS. 1 and 2 when writing a first or second binary value to the bus 2. In particular, this control circuit for the two transistors P1 and N1 is configured to trigger the transistor N1 to the OFF state when it controls an ON state of the transistor P1, and, in a complementary manner, to trigger the transistor P1 to the OFF state when it controls an ON state of the transistor N1.

In other words, the device 3 comprises a control circuit for the two sets 300, the control circuit being configured, when a first binary value is written to bus 2, to:

turn on the transistor P1 and turn off the transistor N1 of the set 300 connected to the terminal A, and turn off the transistor P1 and turn on the transistor N1 of the set 300 connected to the terminal B, and, when writing a second binary value to the bus 2, to:

turn on the transistor P1 and turn off the transistor N1 of the set 100 connected to the terminal B, and to turn off the transistor P1 and to turn on the transistor N1 of the set 100 connected to the terminal A.

In addition, when the sets 300 of the device 3 are not controlled to write a binary value to the bus, the control circuit of the set 300 is, for example, configured to control the OFF state of the transistors N1 and P1 of the two sets 300.

Although a case of a device 3 comprising a control circuit for these two sets 300 has been described above, in another embodiment, each set comprises its own control circuit receiving a write control signal. In this case, in each set, the write control circuit of the set is configured to:

control an ON state of the transistor P1 and an OFF state of the transistor N1 of the set when its write control signal is in a first state, for example a first binary state;

control an OFF state of the transistor P1 and an ON state of the transistor N1 of the set when its write control signal is in a second state, for example a second binary state; and preferably, to control an OFF state of transistors P1 and N1 of the set when its write control signal is in a third state, for example a high impedance state.

In the above embodiment, where each set comprises its own write control circuit, the write control circuits of the two sets are controlled in phase opposition, i.e., when the write control signal of one of the two sets is in its first state, that of the other set is in its second state, and vice versa. Furthermore, preferably, when the write command signal of the first of the two sets is in its third state, the write command signal of the second of the two sets is also in its third state.

The operation of the circuit 310 in the embodiment shown in FIG. 3 is as follows.

When a first value is written to the bus 2, corresponding to the transistor P1 being turned on and the transistor N1 being turned off in the transistor D1 of the set 300, is also turned on by the circuit 210. The node 108 of the set 300 is then at potential Vcc minus the voltage drops between the first and second conduction terminals of each of the transistors D1 and P1. Furthermore, the gate potential of the transistor D2 is then substantially equal to its source potential, thanks to resistor R, with the result that the transistor P2 is blocked. Furthermore, due to a transient current in capacitor C and/or a leakage current in blocked transistor D2, the gate potential of the transistor D2 is defined by the voltage drop across the diode Dvh. Although the transistor D2 is a PMOS transistor with its source structurally connected to the transistor N1, given the potentials present on the gate, source, and drain of the transistor D2, the latter becomes ON because its drain then functionally corresponds to its source electrode. The conductive state of the transistor D2 causes a current to flow through the diode Dhv, and the potential at the gate of the transistor D2 becomes equal to the voltage VDhv across the conductive diode Dhv. The voltage across the capacitive element C is then equal to Vcc minus the voltage drops between the conduction terminals of the two transistors D1 and P1 minus the voltage VDhv. For simplicity, neglecting the voltage drops across the transistors D1, P1, and D2, at this stage the voltage Vcc is present at the node 108 and at the source of the transistor D2, and the voltage across the element C is equal to Vcc-VDhv.

When a second value is written to the bus 2, corresponding to the ON state of the transistor N1, and to the OFF state of the transistor P1 in the set 300, the source of the transistor D2 is set to a potential equal to GND plus the voltage drop between the conduction terminals of the transistor N1. The diode Dhv is then blocked. Since the voltage Vcc-VDhv across the capacitive element C is between the drain and gate of the transistor D2, the latter remains conducting and the node 108 is pulled towards potential GND. Furthermore, as the potential of the node 108 approaches the potential GND, because the voltage across the element C is equal to Vcc-VDhv, the gate potential of the transistor D2 approaches a value of −(Vcc-VDhv), allowing the transistor D2 to be kept conducting. When steady state is reached, the potential of the node 108 is equal to the potential GND plus the voltage drop between the conduction terminals of the transistor N1 in the conducting state plus the voltage drop between the conduction terminals of the transistor P2, which is also in the conducting state.

This value of the node 108 potential is then lower than if the transistor D2 were diode-connected as shown in FIG. 2, because the voltage drop across the body diode of the transistor D2 when it is off is greater than the voltage drop across the conduction terminals of the transistor T2 when it is on.

This allows the maximum negative and positive values of the voltage VOD to be increased.

FIG. 3 illustrates an embodiment in which the element C of the circuit 310 is connected between the drain and the gate of the transistor D2.

Figure 4:
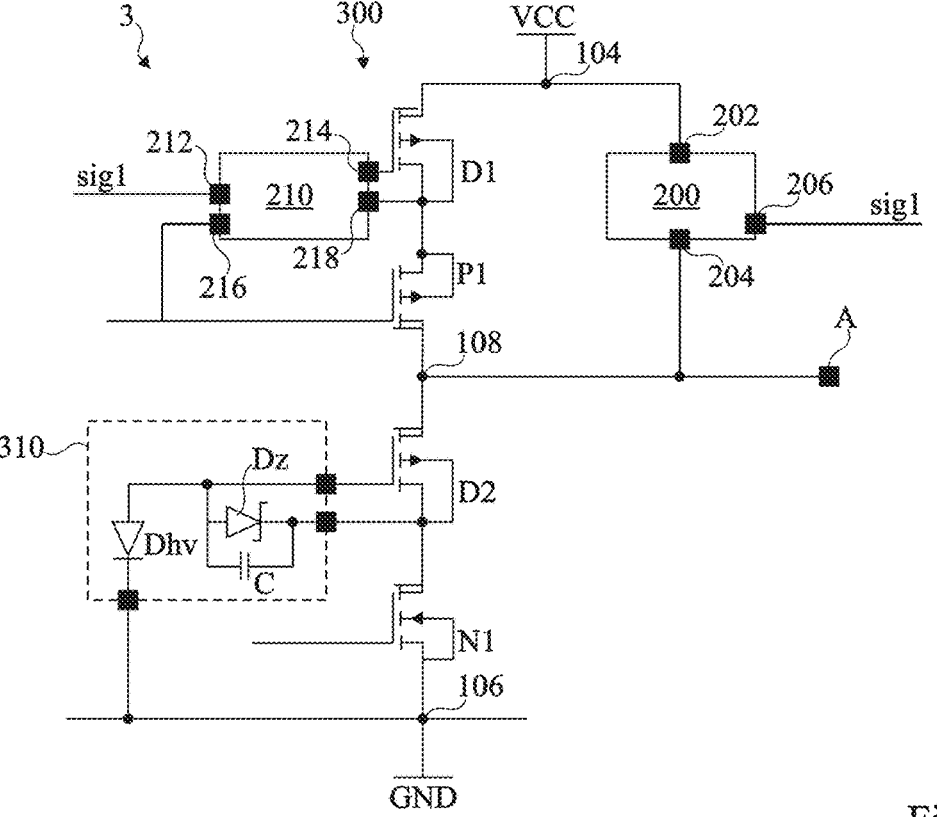
FIG. 4 illustrates an example alternative embodiment of the device shown in FIG. 3.

FIG. 4 illustrates a variant of the device 3 shown in FIG. 3, where the element C of the circuit 310 is connected between the gate and source of the transistor D2.

FIG. 4 shows only the set 300 of the device 3 connected to the terminal A, the other set 300 connected to the terminal B being identical to that shown.

The device 3 in FIG. 4 has many features in common with the device 3 in FIG. 3, and only the differences between these devices 3 are highlighted here. Thus, unless otherwise indicated, all that has been stated for the device 3 of FIG. 3 applies to the device 3 described here in relation to FIG. 4.

In addition to the capacitive element C having, in the device 3 of FIG. 4, a first electrode coupled with, for example connected to, the gate of the transistor D2 and a second electrode coupled with, for example connected to, the source of the transistor D2, in embodiments where the element C couples the gate and source of the transistor D2 with each other, preferably the circuit 310 includes the diode D2 coupling the gate and source of the transistor D2 with each other to protect the transistor D2 from overvoltage between its gate and source. As previously indicated for the embodiment shown in FIG. 3, the diode DZ has its anode coupled with, for example connected to, the gate of the transistor D2, and its cathode coupled with, for example connected to, the source of the transistor D2.

In the example shown in FIG. 4, the circuit 310 is without resistor R. However, in other examples not shown, this resistor R is connected in parallel with the diode D2.

Those skilled in the art will be able to deduce the operation of the circuit 310 of FIG. 4, and therefore more generally of the device 3 of FIG. 4, from the operation of the circuit 310 described in relation to FIG. 3.

Compared with the device 3 shown in FIG. 3, one advantage of having the element C connected in parallel with the diode D2 as shown in FIG. 4 is that the voltages that this element C may have to withstand at its terminals are lower than for the element C in the device shown in FIG. 3. This means, for example, that the element C of the device 3 shown in FIG. 4 can be implemented with less surface area. For example, the element C of the device 3 shown in FIG. 4 can be implemented with a MIS (Metal Insulator Semiconductor) capacitor, which may not be possible for the element C of the device 3 shown in FIG. 3, which may require an element C implemented with a MIM (Metal Insulator Metal) capacitor, a MIS capacitor having a lower capacitance value per unit area than a MIM capacitor.

In the embodiments shown in FIGS. 3 and 4, the circuit 310 switches the transistor D2 ON when the transistor N1 is ON. More particularly, in the embodiments described in the present application, the circuit 310 implements a charge pump with the capacitive element C, which enables a potential to be applied to the gate of the transistor D2 so that the latter is ON when the transistor N1 is ON. The charge pump is said to be negative in that the potential applied to the gate of the transistor D2 to make it conductive when the transistor N1 is conductive, is negative with respect to the potential GND.

Figure 5:
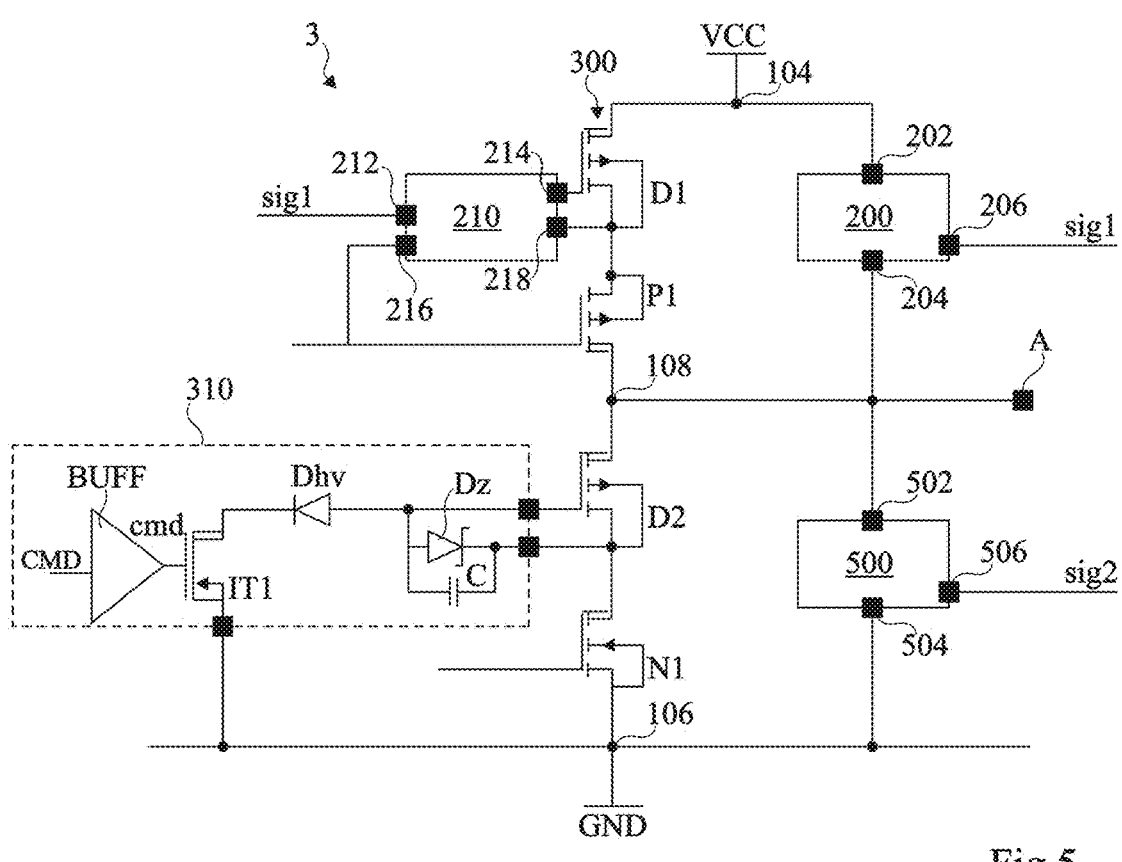
FIG. 5 illustrates an example of another embodiment of a device for a differential two-wire bus, and, more particularly, a device for writing to a differential two-wire bus.

FIG. 5 illustrates an example of a further embodiment of the device 3.

FIG. 5 shows only the set 300 of the device 3 connected to the terminal A, the other set 300 connected to the terminal B being identical to that shown.

The device 3 shown in FIG. 5 has many features in common with the devices 3 shown in FIGS. 3 and 4, and only the differences between the device 3 shown in FIG. 5 and those shown in FIGS. 3 and 4 are highlighted here. Thus, unless otherwise indicated, all that has been stated for the devices 3 shown in FIGS. 3 and 4 applies to the device 3 described here in relation to FIG. 5.

In the example shown in FIG. 5, the circuit 310 comprises, like the circuit 310 shown in FIG. 4, the capacitive element C and the diode D2 connected in parallel between the source and the gate of the transistor D2. However, what will be described in relation to FIG. 5 also applies to a circuit 310 in which the element C couples the gate of the transistor D2 with the drain of this transistor D2.

Compared to the embodiments shown in FIGS. 2 and 3, in this embodiment the cathode of the diode Dhv is not connected to the node 106 at the potential GND, but is coupled with this node 106 via a switch IT1.

In addition, the control circuit is configured to control the switch IT1 on the basis of a signal CMD. For example, the signal CMD is a binary signal in a first binary state when the circuit 310 is to open the switch IT1, and in a second binary state when circuit 310 is to close the switch IT1.

By way of example, the switch IT1 is implemented by an NMOS transistor, for example an NMOS transistor having its source coupled with, preferably connected to, the node 106 and the body region of the transistor IT1, its drain coupled with, preferably connected to, the cathode of the diode Dhv.

By way of example, when the first binary state of the signal CMD is a low state corresponding to the potential GND, the second binary state of the signal CMD is a high state corresponding to the potential Vcc, and the switch IT is implemented by an NMOS transistor, the circuit 310 may comprise a buffer circuit BUFF configured to receive the signal CMD and to supply a control signal cmd to the switch IT, or the signal CMD may be directly applied to the gate of the switch IT1.

By way of example, when the first binary state of the signal CMD is a high state corresponding to the potential Vcc, the second binary state of the signal CMD is a low state corresponding to the potential GND, and the switch IT is implemented by an NMOS transistor, the circuit 310 comprises an inverter configured to receive the signal CMD and to supply a control signal cmd to the gate of the switch IT.

In one embodiment, the signal CMD is determined only as a function of an enabling/disabling signal for the device 3. For example, the signal CMD is in its first binary state corresponding to the open state of the switch IT1 when the enabling/disabling signal indicates that the device 3 is to be disabled, and in a second binary state corresponding to the closed state of the switch IT1 when the enabling/disabling signal indicates that the device 3 is to be enabled.

According to another embodiment, the signal CMD is determined only as a function of a signal sig2 indicating when the potential of the node 108 is lower than the potential of the node 106, which is the case when there is a negative ESD on the node 108. For example, the signal CMD is in its first binary state corresponding to the open state of the switch IT1 when the signal sig2 indicates that the potential of the node 108 is lower than the potential GND, and in a second binary state corresponding to the closed state of the switch IT1 when the signal sig2 indicates that the potential of the node 108 is higher than the potential GND.

In yet another embodiment, the signal CMD is determined as a function of the device 3 enabling/disabling signal and the signal sig2. For example, the signal CMD is in its first binary state corresponding to the open state of the switch IT1 if the signal sig2 indicates that the potential of the node 108 is lower than the potential GND and/or the enabling/disabling signal indicates that the device 3 is to be disabled, and in a second binary state corresponding to the closed state of the switch IT1 otherwise.

For example, the determination of the signal CMD from the enabling/disabling signal and/or the signal sig2 can be implemented, for example with combinatorial logic gates, directly in the circuit 310 or outside it.

In embodiments where the signal CMD is at least partly determined by the signal sig2, according to one embodiment, the set 300 further comprises a detection circuit 500. The circuit 500 is configured to provide the signal sig2 indicating whether the potential of node 108 is below the potential GND or not. By way of example, the signal sig2 is provided on an output 506 of the circuit 500.

By way of example, the circuit 500 is connected to the node 108 and the node 106. For example, the circuit 500 comprises an input 502 connected to the node 108 and an input 504 connected to th node 106.

In operation, if the signal CMD is in its second binary state, the switch IT1 is on, and the operation of the device 3 shown in FIG. 5 is then the same as that described above without the switch IT1. On the other hand, if the signal CMD is in its first binary state, the switch IT1 is off, with the result that the charge pump function is no longer ensured and the capacitive element discharges into the diode Dz (via the leakage current in the reverse-biased diode Dz) and/or the resistor R, depending on what the circuit 310 comprises. The transistor D2 is then no longer held conducting by the voltage across the capacitive element C, and operates as a diode corresponding to its body diode.

Figure 6:
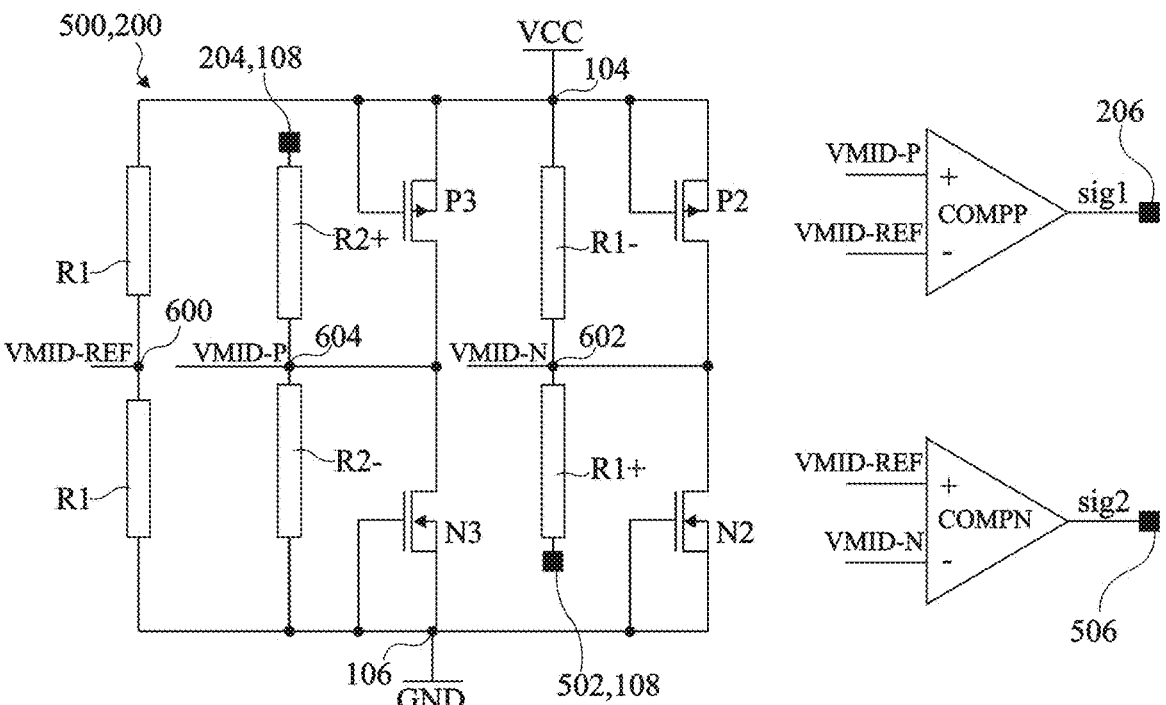
FIG. 6 illustrates an example embodiment of a circuit of the device shown in FIG. 5.

FIG. 6 illustrates an example embodiment of the circuit 500 of the device 3 shown in FIG. 5.

The circuit 500 comprises two identical resistors R1 in series between the nodes 104 and 106. Thus, a node 600 connecting the two resistors R1 to each other provides a reference voltage VMID-REF at a value equal to Vcc/2.

The circuit 500 comprises a resistor R1+ and a resistor R1− connected to the same connection node 602. The resistor R1− is connected between the nodes 104 and 602. The resistor R1+ is connected between the node 602 and the node 108 of the set 300 comprising this circuit 500, i.e., to the terminal or input 502 of the circuit 500. The resistor R1+ has a higher value than the resistor R1−. A VMID-N voltage is available on the node 602.

For example, the resistor R1+ has a resistance value equal to n.Rval+DRval and the resistor R1− has a resistance value equal to n.Rval−Drval, with Rval a resistance value, for example, equal to the resistance value of each of the resistors R1, n a positive integer coefficient determined by a maximum number of the devices 3 that can be simultaneously connected to the bus 2 so as to adjust the maximum current on the terminals A and B of the device 3, and DRval a fraction of the Rval value less than the Rval value.

The circuit 500 also includes a PMOS transistor P2 connected between the nodes 104 and 602, the source and gate of the transistor P2 being connected to the node 104, and an NMOS transistor N2 connected between the nodes 602 and 106, the source and gate of the transistor N2 being connected to the node 106. A voltage VMID-N is available on the node 602.

The circuit 500 includes a comparator COMPN configured to compare the voltages VMID-REF and VMID-N with each other, and to provide the signal sig2. For example, the comparator COMPN has an input, e.g., inverting −, configured to receive the voltage VMID-N, an input, e.g., noninverting +, configured to receive the voltage VMID-REF, and an output configured to provide the signal sig2, the output of the comparator COMPN being, for example, connected to the output 506 of the circuit 500.

In the circuit 500, the transistors P2 and N2 limit the maximum negative and positive values of the voltage VMID-N in the event of a negative or negative ESD on the node 108 to which the circuit 500 is connected, or in the event of a positive or negative ground offset.

According to one embodiment, the circuit 200 can be implemented in a similar and complementary way to the circuit 500.

According to one embodiment, the circuit 200 is implemented in a similar and complementary way to the circuit 500, and these two circuits 200 and 500 include elements in common, as illustrated in the example shown in FIG. 6. In this case, the circuit 200 shares the resistors R1 with the circuit 500.

According to one embodiment, the circuit 200 comprises a resistor R2+, a resistor R2−, an NMOS transistor N3, a PMOS transistor P3, and a comparator COMPP.

The resistors R2+ and R2− are connected to the same connection node 604. The resistor R2− is connected between the nodes 106 and 604. The resistor R2+ is connected between the node 604 and the node 108 of the set 300 comprising this circuit 200, i.e., to the terminal or input 204 of the circuit 200. The resistor R2+ has a higher value than the resistor R2−. A voltage VMID-P is available at the node 604. For example, the resistors R2+ and R2− have resistance values identical to the resistance values of the respective resistors R1+ and R1−.

The transistor P3 is connected between the nodes 104 and 604, with the source and gate of the transistor P3 connected to the node 104. The transistor N3 is connected between the nodes 604 and 106, with the source and gate of the transistor N3 connected to the node 106. A voltage VMID-P is available at the node 604.

The comparator COMPP is configured to compare the voltages VMID-REF and VMID-P with each other, and to supply the signal sig1. For example, the comparator COMPP has an input, e.g., inverting −, configured to receive the voltage VMID-REF, an input, e.g., non-inverting +, configured to receive the voltage VMID-P, and an output configured to provide the signal sig1, the output of the comparator COMPP being, for example, connected to the output 206 of the circuit 200.

In the circuit 200, the transistors P3 and N3 limit the maximum negative and positive values of the voltage VMID-P in the event of a negative or positive ESD on the node 108 to which the circuit 200 is connected, and in the event of a positive or negative ground offset.

In the device 3 shown in FIG. 5, when the switch IT1 is switched off by the signal CMD, for example following the detection of a negative ESD by the circuit 500, the discharge of the capacitive element C may be too long, and the transistor D2 may still be conducting during the negative ESD that caused the switch IT1 to be switched off.

Thus, according to one embodiment, in each set 300 of the device 3, the circuit 310 is further configured to force the gate of the transistor D2 to the potential Vcc when a negative ESD causes the switch IT1 to switch off, so that the transistor D2 quickly switches off and the negative ESD does not result in a current flowing from the node 106 to the node 108 via the transistor D2. In fact, in the OFF state, the transistor D2 is equivalent to its body diode, which prevents such a current from flowing.

Figure 7:
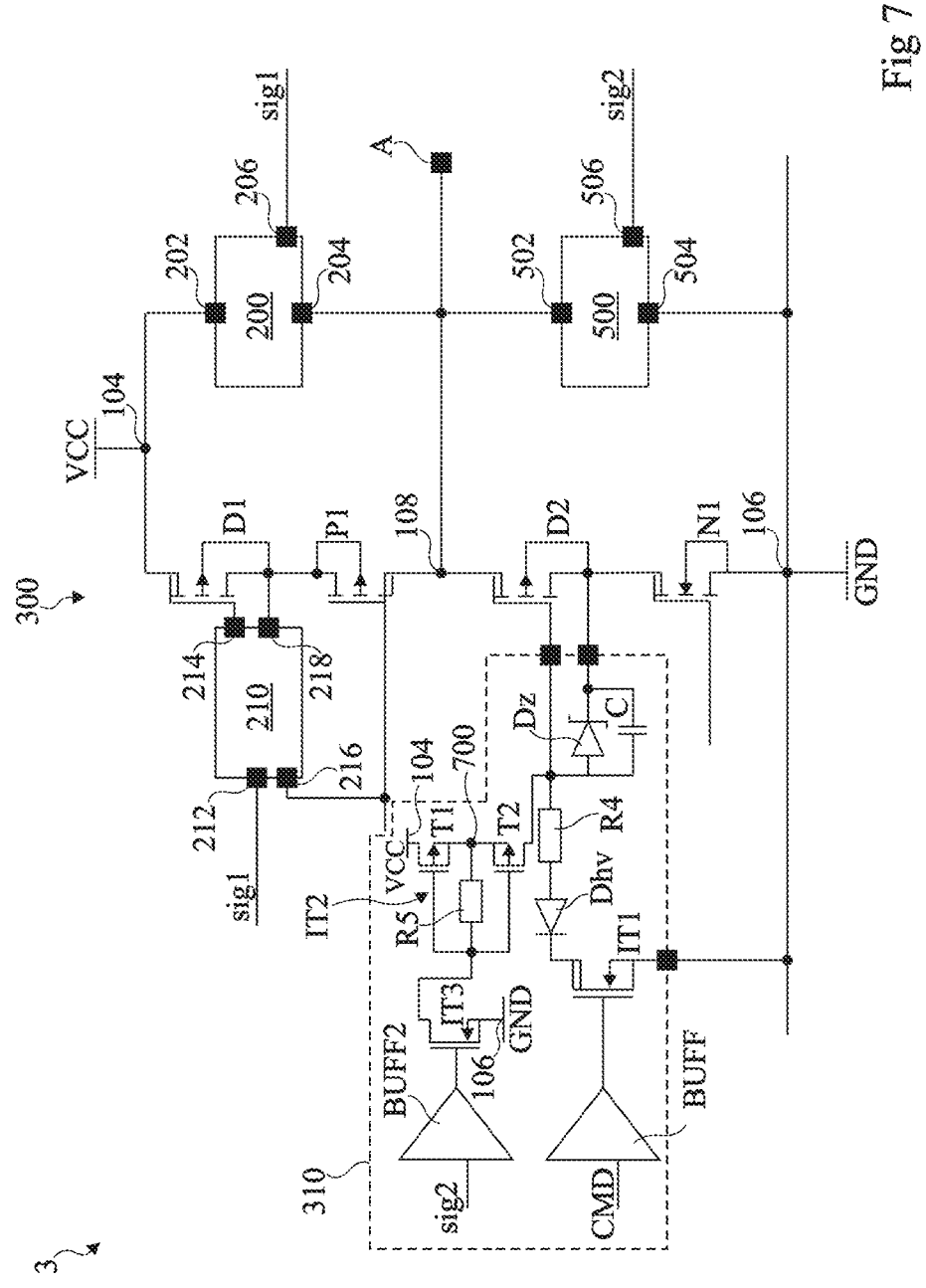
FIG. 7 illustrates an example of yet another embodiment of a device for a differential two-wire bus, and, more particularly, a device for writing to a differential two-wire bus.

FIG. 7 shows an example of yet another embodiment of the device 3, in which the control circuit 310 of each set 300 of the device 3 is configured to force the potential Vcc on the gate of the transistor D2 when a negative ESD is detected, for example, by the circuit 500.

FIG. 7 shows only the set 300 of the device 3 connected to the terminal A, the other set 300 connected to the terminal B being identical to that shown.

The device 3 shown in FIG. 7 has many features in common with the device 3 shown in FIG. 5, and only the differences between the device 3 shown in FIG. 7 and that shown in FIG. 5 are highlighted here. Thus, unless otherwise indicated, all that has been stated for the device 3 shown in FIG. 5 applies to the device 3 described here in relation shown in FIG. 7.

In the example shown in FIG. 7, the circuit 310 comprises, like the circuit 310 shown in FIG. 5, the capacitive element C, and the diode D2 connected in parallel between the source and the gate of the transistor D2. However, what will be described in relation to FIG. 7 also applies to a circuit 310 in which the element C couples the gate of the transistor D2 with the drain of this transistor D2.

Compared to the circuit 310 shown in FIG. 5, in this embodiment the circuit 310 further comprises a switch IT2 coupling the gate of the transistor D2 with the node 104 at the potential Vcc. The circuit 310 is configured to turn the switch IT2 on when a negative ESD is detected. For example, the circuit 310 is configured to turn the switch IT2 on as long as the signal sig2 indicating the potential of the node 108 is below the potential GND.

In addition, compared with the circuit 310 shown in FIG. 5, in this embodiment the circuit 310 includes a resistor R4 coupling the gate of the transistor D2 with the anode of the diode Dhv. This resistor R4 protects the node 108 when the potential of the node 108 is higher than the potential Vcc.

According to an embodiment, in each of the two sets 300, the switch comprises:

two PMOS transistors T1 and T2 in series between the node 104 and the gate of the transistor D2, the transistors T1 and T2 having their sources connected to each other (node 700), and a resistor R5 coupling the gate of each of the two transistors T1 and T2 with the sources (node 700) of the two transistors T1 and T2.

As an example, each transistor T1, T2 also has its source connected to its body region.

As an example, the transistor T1 has its drain connected to the node 104, while the transistor T2 has its drain connected to the gate of the transistor D2.

In such an embodiment, where the switch IT2 is implemented with the transistors T1 and T2, applying the potential GND to the gate of the transistors T1 and T2 switches the switch IT2 on. Thus, the circuit 310 further comprises a switch IT3, for example an NMOS transistor, coupling the gates of the transistors T1 and T2 with the node 106, so as to set the gates of the transistors T1 and T2 to the potential of the node 106 when the switch IT3 is on. The circuit 310 is then configured to turn the switch IT3 on when signal sig2 indicates that the potential of the node 108 of the set 300 is less than the potential GND.

For example, when the switch IT3 is an NMOS transistor with its source connected to the node 106 and its drain connected to the gates of the transistors T1 and T2, the circuit 310 is configured to apply the potential Vcc to the gate of the transistor IT3 when the signal sig2 indicates that the potential of the node 108 is less than the potential GND.

By way of example, when the signal sig2 is at a high level corresponding to the potential Vcc if the potential of the node 108 is below potential GND, and at a low level corresponding to the potential GND otherwise, the circuit 310 may comprise a buffer circuit BUFF2 configured to receive the signal sig2 and to supply a control signal corresponding to the gate of the transistor IT3.

As an alternative example, when the signal sig2 is at a high level corresponding to the potential Vcc if the potential of the node 108 is below the potential GND, and at a low level corresponding to the potential GND otherwise, the gate of the transistor IT3 receives the signal sig2 directly.

As a further alternative example, when the signal sig2 is at a low level corresponding to the potential GND if the potential of the node 108 is below the potential GND, and at a high level corresponding to the potential Vcc otherwise, the circuit 310 may comprise an inverter circuit configured to receive the signal sig2 and to supply a control signal corresponding to the gate of the transistor IT3.

Figure 8:
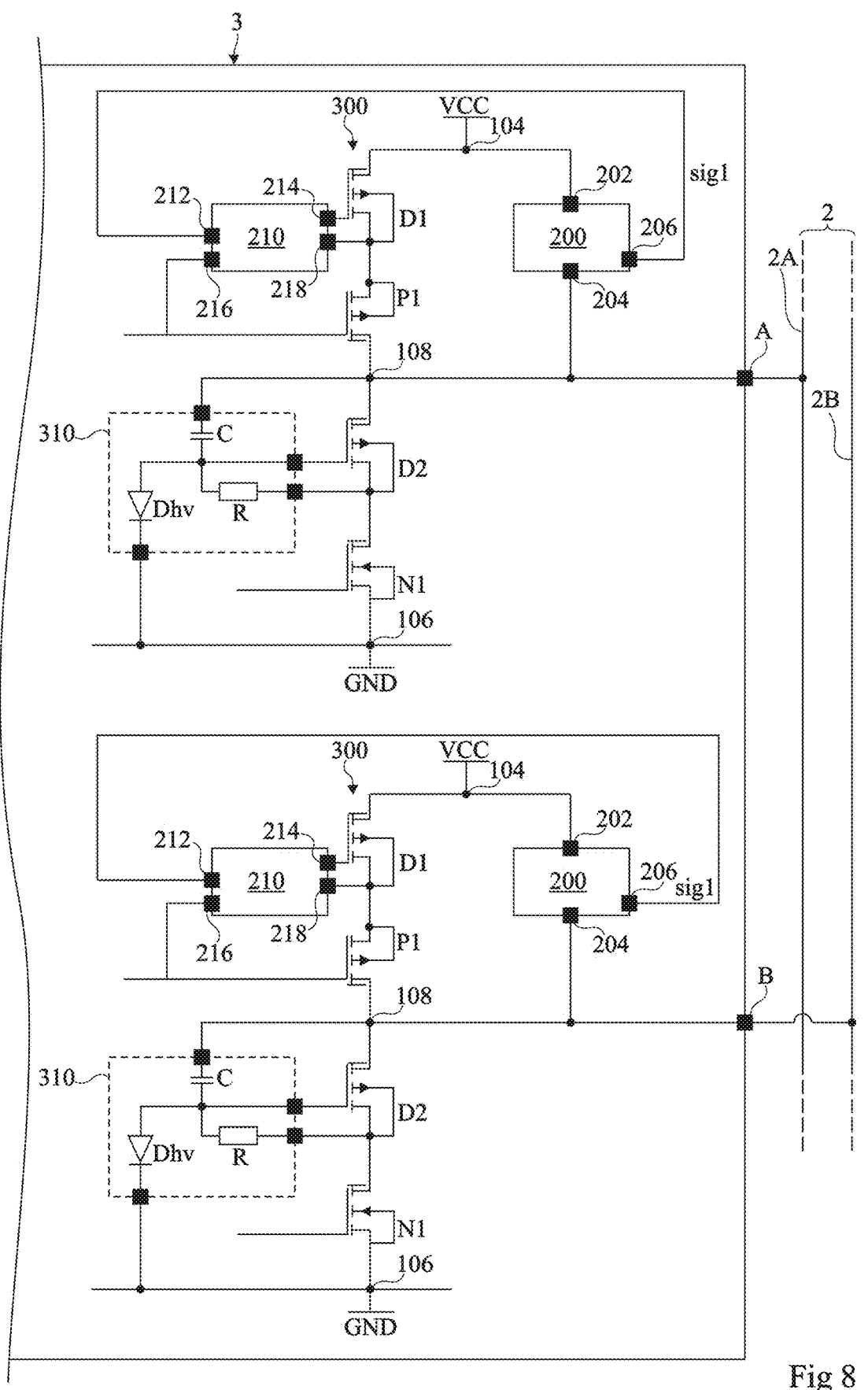
FIG. 8 illustrates an example embodiment of a device for a two-wire bus.

FIG. 8 illustrates an example embodiment of a two-wire bus device 3. More particularly, FIG. 8 illustrates an example device 3 in which the two sets 300 of the device 3 are shown, these two sets 300 each corresponding to the set 300 described in relation to FIG. 3, it being understood that, in other non-illustrated example embodiments of the device 3, each of the sets 300 of the device 3 shown in FIG. 8 is replaced by one of the sets described in relation to any one of FIGS. 4, 5, and 7.

In FIG. 8, one of the sets 300 (top in FIG. 8) is connected to the terminal A of the device 3, itself intended for connection to the conductor 2A of the bus 2, and the other of the sets 300 (bottom in FIG. 8) is connected to the terminal B of the device 3, itself intended for connection to the conductor 2B of the bus 2. In FIG. 8, the terminals A and B of the device 3 are shown connected to the conductors 2A and 2B, respectively.

Embodiments of a device 3 comprising two identical sets 300 have been described in relation to FIGS. 3, 4, 5, 7, and 8.

One embodiment provides a device comprising a single set 300. Those skilled in the art will understand that two devices each comprising a single set 300 then have the same function as the device 3 with two sets 300 previously described.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A half-bridge circuit comprising:

a first P-channel metal-oxide-semiconductor (PMOS) transistor having its drain connected to a first node for applying a power supply potential and its source connected to its body region;

a second PMOS transistor having its source connected to its body region and to the source of the first PMOS transistor, and its drain connected to an intermediate node;

a third PMOS transistor having its drain connected to the intermediate node and its source connected to its body region;

a fourth N-channel metal-oxide-semiconductor (NMOS) transistor having its drain connected to the source of the third PMOS transistor and its source connected to a second node for applying a reference potential; and a control circuit of the third PMOS transistor comprising a bootstrap charge pump, the bootstrap charge pump comprising a capacitive element having a first electrode coupled with a gate of the third PMOS transistor, the bootstrap charge pump being configured to charge the capacitive element from the intermediate node and without a clock signal.

2. The half-bridge circuit according to claim 1, wherein the capacitive element has a second electrode coupled with the drain or the source of the third PMOS transistor, and the bootstrap charge pump comprises:

a first diode having its anode coupled with the gate of the third PMOS transistor and its cathode coupled with the second node; and at least one of a resistor connected between the source and the gate of the third PMOS transistor, or a Zener diode connected between the source and the gate of the third PMOS transistor with its anode at a gate-side.

3. The half-bridge circuit according to claim 2, wherein:

the second electrode of the capacitive element is coupled with the source of the third PMOS transistor; and the bootstrap charge pump comprises the Zener diode connected between the source and the gate of the third PMOS transistor.

4. The half-bridge circuit according to claim 2, wherein:

the second electrode of the capacitive element is coupled with the drain of the third PMOS transistor.

5. The half-bridge circuit according to claim 2, wherein the control circuit further comprises a first switch coupling the first diode with the second node, the control circuit being configured to control the first switch from a first binary signal.

6. The half-bridge circuit according to claim 5, wherein the first binary signal is at least in part determined from an enabling/disabling signal for enabling/disabling the half-bridge circuit so that the first switch is open in response to the enabling/disabling signal indicating the half-bridge circuit has to be disable.

7. The half-bridge circuit according to claim 5, wherein the first switch is implemented by a NMOS transistor having its source connected to its body region, its drain coupled with the first diode, and its source coupled with the second node.

8. The half-bridge circuit according to claim 5, wherein:

the half-bridge circuit further comprises a detection circuit configured to deliver a second binary signal indicating that a potential of the intermediate node is less than the reference potential; and the first binary signal is determined at least in part from the second binary signal so that the first switch of the control circuit is open in response to the second binary signal indicating that the potential at the intermediate node is less than the reference potential.

9. The half-bridge circuit according to claim 8, wherein the control circuit is configured to drive the gate of the third PMOS transistor to a supply voltage in response to the second binary signal indicating that the potential at the intermediate node is less than the reference potential.

10. The half-bridge circuit according to claim 9, wherein the control circuit further comprises a second switch coupling the gate of the third PMOS transistor with the first node, and a second resistor coupling the gate of the third PMOS transistor with the anode of the first diode, the control circuit being configured to turn the second switch to an ON state in response to the second binary signal indicating that the potential at the intermediate node is less than the reference potential.

11. The half-bridge circuit according to claim 10, wherein:

the second switch comprises:

two PMOS transistors in series between the first node and the gate of the third PMOS transistor and having sources connected to each other; and a third resistor coupling each gate of the two PMOS transistors with the sources of the two PMOS transistors;

the control circuit further comprises a third switch, for example a NMOS transistor, coupling gates of its two PMOS transistors with the second node; and the control circuit is configured to turn its third switch to the ON state in response to the second binary signal indicating that the potential at the intermediate node is less than the reference potential.

12. The half-bridge circuit according to claim 8, wherein the detection circuit configured to deliver the second binary signal comprises:

two identical resistors in series between the first and second nodes, wherein a third node interconnecting the two identical resistors with each other is configured to deliver a reference voltage;

a fourth resistor and a fifth resistor connected to a fourth node, the fourth resistor being connected between the first node and the fourth node, the fifth resistor having a value higher than the fourth resistor and being connected between the fourth node and the intermediate node;

a fourth PMOS transistor connected between the first node and the fourth node, and having its source and gate connected to the first node;

a fourth NMOS transistor connected between the fourth node and the second node and having its source and gate connected to the second node, the fourth node being configured to deliver a first voltage; and a comparator configured to compare the first voltage with the reference voltage, and to deliver the second binary signal.

13. The half-bridge circuit according to claim 1, wherein the half-bridge circuit further comprises a first control circuit of the first PMOS transistor configured to turn the first PMOS transistor to an ON state in response to the second PMOS transistor being ON.

14. The half-bridge circuit according to claim 1, wherein the half-bridge circuit further comprises:

a detection circuit configured to deliver a third signal indicating that a potential at the intermediate node is higher than the power supply potential; and a first control circuit of the first PMOS transistor configured to:

turn the first PMOS transistor to an ON state in response to the second PMOS transistor being ON and the third signal indicating that the potential at the intermediate node is less than the power supply potential; and turn the first PMOS transistor to an OFF state in response to the third signal indicating that the potential at the intermediate node is higher than the power supply potential.

15. The half-bridge circuit according to claim 12, wherein the half-bridge circuit further comprises:

a second detection circuit configured to deliver a third signal indicating that the potential at the intermediate node is higher than the power supply potential; and a first control circuit of the first PMOS transistor configured to:

turn the first PMOS transistor to an ON state in response to the second PMOS transistor being ON and the third signal indicating that the potential at the intermediate node is less than the power supply potential; and turn the first PMOS transistor to an OFF state in response to the third signal indicating that the potential at the intermediate node is higher than the power supply potential; and wherein the second detection circuit configured to deliver the third signal comprises:

a sixth resistor and a seventh resistor connected to a fifth node, the sixth resistor being connected between the intermediate node and the fifth node, the seventh resistor having a second value lower than the sixth resistor and being connected between the fifth and second nodes;

a fifth PMOS transistor connected between the first node and the fifth node and having its source and gate connected to the first node;

a fifth NMOS transistor connected between the second node and the fifth node and having its source and gate connected to the second node, the fifth node being configured to deliver a second voltage; and a second comparator configured to compare the second voltage with the reference voltage, and to deliver the third signal.

16. The half-bridge circuit according to claim 1, further comprising a second control circuit of the second PMOS and fourth NMOS transistors configured to:

control the OFF state of the fourth transistor and the ON state of the second PMOS transistor in response to a write control signal being at a first state;

control the OFF state of the second PMOS transistor and the ON state of the fourth transistor in response to the write control signal being at a second state; and control the OFF state of each of the second PMOS and fourth NMOS transistors in response to the write control signal being at a third state.

17. A device comprising:

first and second terminals configured to be respectively connected to first and second lines of a two-wire bus; and two identical half-bridge circuits, each of the identical half-bridge circuits comprising:

a first P-channel metal-oxide-semiconductor (PMOS) transistor having its drain connected to a first node for applying a power supply potential and its source connected to its body region;

a second PMOS transistor having its source connected to its body region and to the source of the first PMOS transistor, and its drain connected to an intermediate node;

a third PMOS transistor having its drain connected to the intermediate node and its source connected to its body region;

a fourth N-channel metal-oxide-semiconductor (NMOS) transistor having its drain connected to the source of the third PMOS transistor and its source connected to a second node for applying a reference potential; and a control circuit of the third PMOS transistor comprising a bootstrap charge pump, the bootstrap charge pump comprising a capacitive element having a first electrode coupled with a gate of the third PMOS transistor, the bootstrap charge pump being configured to charge the capacitive element from the intermediate node and without a clock signal;

wherein a first half-bridge circuit of the two identical half-bridge circuits has its intermediate node connected to the first terminal; and wherein a second half-bridge circuit of the two identical half-bridge circuits has its intermediate node connected to the second terminal.

18. The device according to claim 17, wherein, for each half-bridge circuit, the capacitive element has a second electrode coupled with the drain or the source of the third PMOS transistor, and the bootstrap charge pump further comprises:

a first diode having its anode coupled with the gate of the third PMOS transistor and its cathode coupled with the second node; and at least one of a resistor connected between the source and the gate of the third PMOS transistor, or a Zener diode connected between the source and the gate of the third PMOS transistor with its anode at a gate-side.

19. The device according to claim 17, wherein each half-bridge circuit further comprises a first control circuit of the first PMOS transistor configured to turn the first PMOS transistor to an ON state in response to the second PMOS transistor being ON.

20. The device according to claim 17, wherein each half-bridge circuit further comprises:

a detection circuit configured to deliver a third signal indicating that a potential at the intermediate node is higher than the power supply potential; and a first control circuit of the first PMOS transistor configured to:

turn the first PMOS transistor to an ON state in response to the second PMOS transistor being ON and the third signal indicating that the potential at the intermediate node is less than the power supply potential; and turn the first PMOS transistor to an OFF state in response to the third signal indicating that the potential at the intermediate node is higher than the power supply potential.

* * * * *